United States Patent [19]

Vukanovic

[11] Patent Number: 4,536,640
[45] Date of Patent: Aug. 20, 1985

[54] HIGH PRESSURE, NON-LOGICAL THERMAL EQUILIBRIUM ARC PLASMA GENERATING APPARATUS FOR DEPOSITION OF COATINGS UPON SUBSTRATES

[75] Inventor: Vladimir Vukanovic, Rochester, N.Y.

[73] Assignee: The Standard Oil Company (Ohio), Cleveland, Ohio

[21] Appl. No.: 398,151

[22] Filed: Jul. 14, 1981

[51] Int. Cl.³ .............................. B23K 9/00; B05D 1/08
[52] U.S. Cl. ........................ 219/121 PR; 219/121 PL; 219/121 PM; 427/34; 427/38; 313/231.51
[58] Field of Search ................. 219/121 PL, 121 PM, 219/121 PP, 121 PQ, 121 PN, 121 P, 123; 204/192 E, 192 N, 164; 313/231.31–231.51; 156/345, 643, 646; 427/34, 38, 39

[56] References Cited

U.S. PATENT DOCUMENTS

| | | | |
|---|---|---|---|
| Re. 30,635 | 6/1981 | Kuppers et al. | 427/38 |
| 3,644,782 | 2/1972 | Sheer et al. | 219/121 PR |
| 3,894,209 | 7/1975 | Fairbairn | 219/121 PL |
| 3,940,641 | 2/1976 | Dooley | 219/121 PR |
| 3,998,718 | 12/1976 | Melliar-Smith | 219/121 PG |
| 4,101,411 | 7/1978 | Suzuki et al. | 219/121 PG |
| 4,115,184 | 9/1978 | Poulsen | 219/121 PG |
| 4,277,304 | 7/1981 | Horiike et al. | 219/121 PG |
| 4,328,257 | 5/1982 | Muehlberger et al. | 219/121 P |

Primary Examiner—M. H. Paschall
Attorney, Agent, or Firm—Larry W. Evans; Joseph G. Curatolo; Jeffrey A. Wyand

[57] ABSTRACT

An apparatus for deposition of coatings upon substrates generates a non-local thermal equilibrium arc plasma at the relatively high pressure of at least approximately 1 atmosphere. A closed chamber (25) is defined by a cylindrical anode (11) and annular housings (21, 22) carrying transparent end plates (23, 24). A pencil-shaped cathode (12) is passed through one end plate (23 or 24) coaxially into chamber (25) so that its tapered end (20) is spatially proximate to an exit orifice (44) centrally located in anode (11). Gas ports (30, 31) permit the introduction of a preselected gaseous environment at the desired pressure into chamber (25). A low-current arc is struck between anode (11) and cathode (12) establishing the desired plasma. Two coils (33, 34) are coaxially placed radially outward of both ends of the chamber in a Helmholtz coil configuration to generate a uniform magnetic field in chamber (25) and induce rotation of the arc plasma. The coating material is introduced into the plasma as by a reservoir (40) in cathode (12) and its excited species ejected through exit orifice (44) in a plasma jet for deposition upon any substrate adjacent thereto.

11 Claims, 4 Drawing Figures

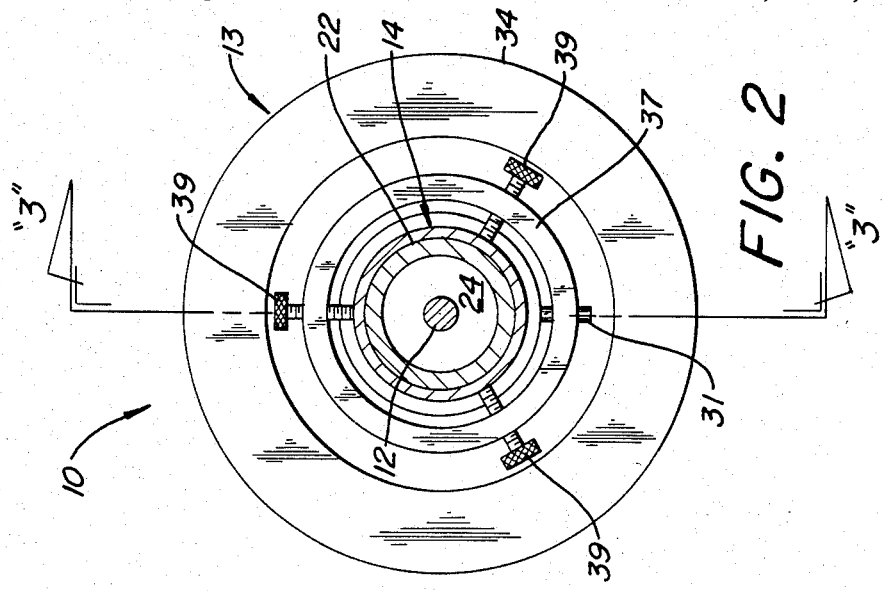
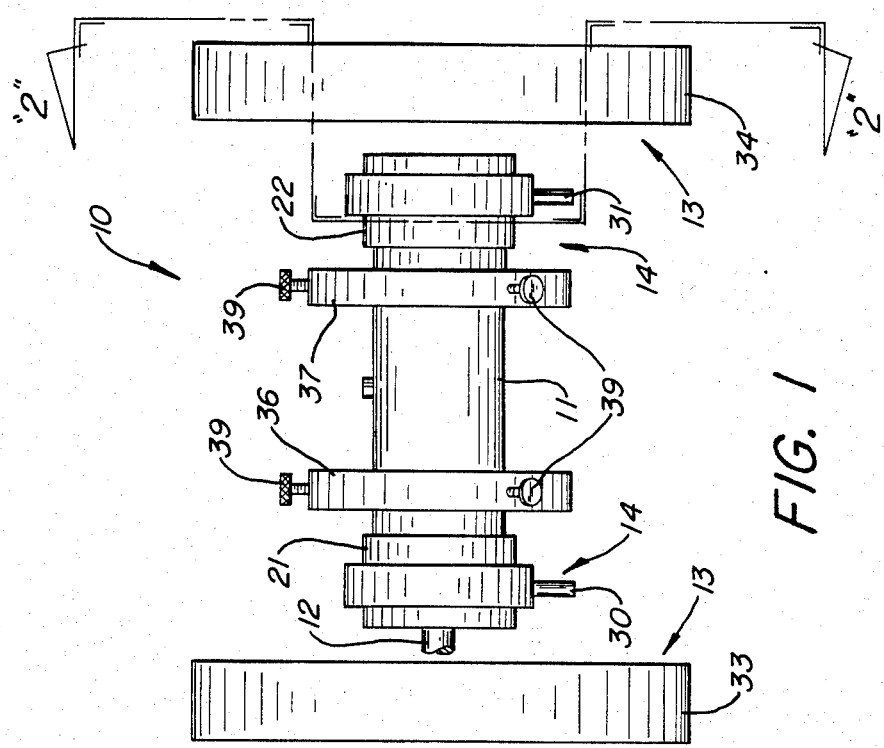

4,536,640

HIGH PRESSURE, NON-LOGICAL THERMAL EQUILIBRIUM ARC PLASMA GENERATING APPARATUS FOR DEPOSITION OF COATINGS UPON SUBSTRATES

TECHNICAL FIELD

The present invention relates generally to an apparatus for generating an arc plasma in non-local thermal equilibrium. More particularly, the present invention pertains to such an apparatus for deposition of coatings at pressures from about 0.1 to 3 atmospheres.

BACKGROUND ART

Various applications require the deposition of thin, smooth and uniform coatings on substrates. Where the application necessitates deposition on all sides of the substrate, it has been found desirable to place the substrate in a thermionic emission of the coating material induced by magnetron sputtering or plasma spraying. Substrates such as microballoons have been coated using low pressure plasma sources by bouncing the substrates or by gas jet levitation. However, if the targets are bounced during the deposition process, the coating can be damaged or the targets tend to adhere to the bouncing plate or to each other due to either electrostatic interactions or cold welding. Levitation processes using gas jets during the coating process are hampered due to the electrostatic interaction between the target and the levitator, while the low pressure required for sputtering hampers the levitation process.

Plasma coating processes heretofore have also been carried out at similar low pressures principally because it is under these conditions that a plasma is not influenced by local thermal equilibrium (hereinafter referred to as "LTE") conditions. A plasma exhibiting non-LTE contains many heavy species (e.g. atomic free radical and excited molecular, in ground, ionized or excited states) of the coating material at temperatures lower than the electron temperatures, significantly facilitating the carriage of the coating material in the plasma to the substrate and rendering unnecessary periodic quenching of the plasma. Unfortunately, at the low pressures conducive to non-LTE conditions, it is often difficult to levitate substrates, and the rate of deposition and yield are unacceptably low.

Increasing the plasma operating pressure to the relatively high pressure of at least approximately 0.1 atmosphere may result in a more extensive LTE influence, depending upon arc current utilized, as well as species in the plasma (low ionization or molecular species). Although levitation of substrates is easier, and deposition rate, yield and heat conductivity are all greater under these conditions, few, if any, atomic and free radical species of the coating material exist in the plasma, deleteriously affecting the carriage of the coating material to the substrate. Accordingly, existing plasma deposition apparatus have been designed to operate at pressures of only thousandths of an atmosphere to foster non-LTE conditions. Additionally, high pressure plasma deposition apparatus almost universally has been in the form of a "spray gun" often with a complex combination of multiple chambers.

In recent years a type of arc plasma source radically different in structure than that previously employed as sources for plasma depositions has been developed for use as light source in spectroscopy. This source provides a horizontal or vertical rotating arc burning in a graphite tube in air immersed within a magnetic field to increase the residence time of particles in the plasma, for better analysis. We have found that a modified form of this source may be utilized to establish and maintain a non-LTE plasma at the relatively high pressures noted above and facilitate the deposition of substrates with coatings.

DISCLOSURE OF INVENTION

It is an object of the present invention to provide an apparatus for generating an arc plasma in non-local thermal equilibrium at relatively high pressure suitable for deposition of coatings upon substrates.

It is another object of the present invention to provide an apparatus for generating an arc plasma, as above, in which substrates may be levitated to facilitate uniform coating.

It is another object of the present invention to provide an apparatus for generating an arc plasma, as above, in which the deposition rate is fast and controllable.

It is a further object of the present invention to provide an apparatus for generating an arc plasma, as above, in which heavy species of the coating material exist at temperatures lower than the electron temperature, significantly facilitating the carriage of the coating material in the plasma to the substrate and rendering unnecessary periodic quenching of the plasma.

It is another object of the present invention to provide an apparatus for generating an arc plasma, as above, in which the plasma heat conductivity and concentration of activated species is greater and the mean free paths shorter than that occurring in a low pressure, non-LTE plasma.

These and other objects and advantages of the present invention over existing prior art forms will become more apparent and fully understood from the following description in conjunction with the accompanying drawings.

In general, an apparatus for deposition of materials upon a substrate embodying the concept of the present invention includes means for generating a non-local thermal equilibrium arc plasma, means for establishing a magnetic field in the region of the means for generating an arc plasma to induce motion of the arc plasma, and means for establishing in this region a preselected gaseous environment at a pressure of at least approximately 0.1 atmosphere. The means for generating an arc plasma includes a first electrode and a second electrode proximate thereto both for establishing field conditions in which the arc plasma may exist, the aforesaid region being between these electrodes, and further including means for generating an electrical current of at least approximately 0.5 amperes, and preferably 2 to about 10 amperes, between these electrodes so as to maintain non-local thermal equilibrium.

BRIEF DESCRIPTION OF THE DRAWINGS

FIG. 1 is a front elevational view of an exemplary apparatus in accordance with the concept of the present invention having a cathode feed reservoir for the introduction of the deposition material into the plasma (seen in FIG. 3), and an exit orifice to effect deposition external to the anode in a plasma jet.

FIG. 2 is a side elevational view of the apparatus depicted in FIG. 1 taken substantially along line 2—2 of FIG. 1.

PREFERRED EMBODIMENT FOR CARRYING OUT THE INVENTION

Figure 3:
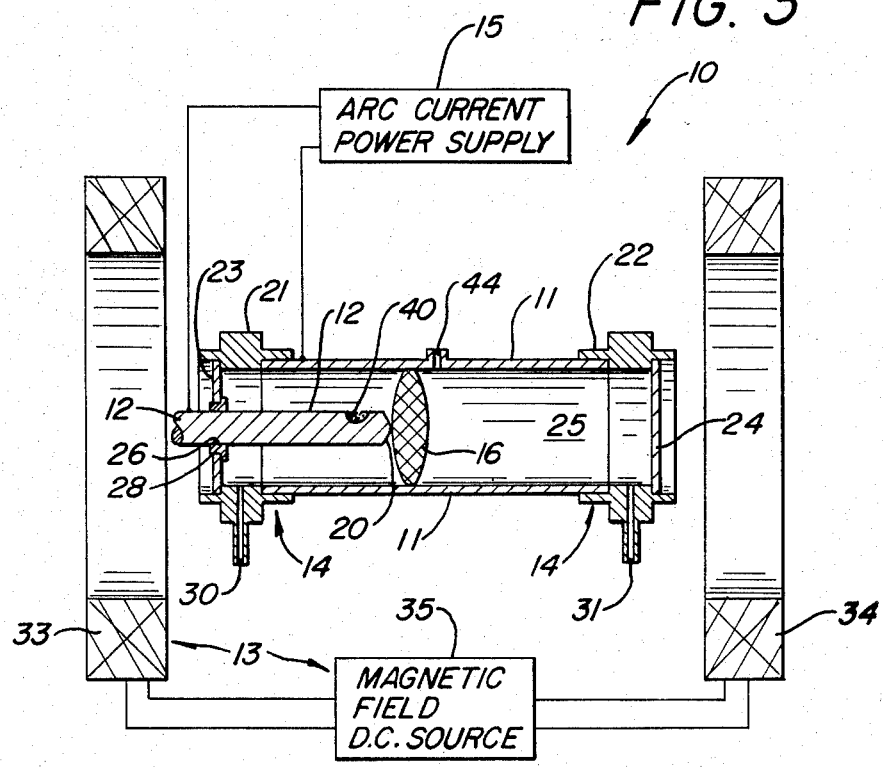
FIG. 3 is a vertical cross-sectional view of the apparatus depicted in FIGS. 1 and 2 taken substantially along line 3—3 of FIG. 2.

FIGS. 1, 2 and 3 illustrate an apparatus, generally indicated by the numeral 10, for the deposition of materials upon substrates by means of an arc generated plasma operating under high pressure and non-local thermal equilibrium (hereinafter referred to as "non-LTE") conditions. Apparatus 10 broadly includes anode 11, cathode 12, magnetic field generator 13, environmental control 14, and arc current power supply 15.

Anode 11 is a cylindrically shaped hollow electrode, preferably formed of a suitable conductive material such as graphite or tungsten, capable of withstanding the current and temperature conditions as are known to occur in generating an arc plasma. Cathode 12 is a cylindrically shaped electrode, smaller in diameter than that of anode 11 and tapered at one end 20, also preferably formed of a suitable conductive material similar to that of anode 11 and most preferably of graphite. The tapered end 20 of cathode 12 is extended coaxially within anode 11 by any appropriate mechanism such as that described hereinafter. In this configuration impression of the necessary voltage and current explained below between anode 11 and cathode 12 will result in an arc being struck between tapered end 20 of cathode 12 and the inner periphery of anode 11 radially closest thereto.

Environmental control 14 permits selected control of the environment between anode 11 and cathode 12 necessary for the maintenance of high pressure, non-LTE conditions in the arc plasma, and furnishes a vehicle by which the deposition material may be introduced into the arc plasma. Environmental control 14 includes two annular end plate housings 21, 22 into which the ends of anode 11 are inserted, and two end plates 23, 24 carried respectively in housings 21, 22, all of which together with anode 11 define a closed, hermetically sealed chamber 25 interior to anode 11. Of course, housings 21, 22 and end plates 23, 24 must be selected of material such as ceramic capable of withstanding the extreme temperatures (typically up to several thousand degrees centigrade) generated during operation of apparatus 10. Additionally, it may be useful to permit direct visual observation of the arc plasma during operation. Housings 21, 22 made of ceramics such as "Lava" material available from 3M Company, South Carolina, U.S.A., and end plates 23, 24 made of sapphire have been found to meet the necessary temperature constraints and permit relatively distortion free viewing of the arc plasma.

Cathode 12 may pass through a bore 26 in either end plate 23, 24 (for illustration purposes cathode 12 is shown passing through end plate 23) and a gasket 28 interposed between bore 26 and cathode 12 to more readily provide axial support to cathode 12 and maintain chamber 25 hermetically sealed from the ambient environment. Gas ports 30, 31 are bored respectively in housings 21, 22 in order to introduce, exhaust and maintain a preselected gaseous environment at a preselected pressure within chamber 25.

Deposition of materials carried as atomic species within an arc plasma may be greatly facilitated where the arc plasma is caused to move and most preferably to rotate in a preselected spatial region. An arc struck and caused to rotate within apparatus 10 between tapered end 20 of cathode 12 and the inner periphery of anode 11 will generate a similarly rotating plasma region which, over time, would define and appear as a disc shaped region 16.

Rotation of the plasma arc may be induced by generation of a magnetic field having flux lines at right angles to all points along the circular perimeter of anode 11. One established technique for furnishing such a magnetic field is the use of a so-called Helmholtz coil arrangement in which two coils 33 and 34 of greater diameter than that of anode 11 are positioned in longitudinal axial alignment with anode 11 radially outward of both ends of chamber 25. Upon excitation by a suitable direct current source 35 the requisite stationary magnetic field is established with a highly uniform field magnitude and direction. Ring supports 36 and 37 having a plurality of individually adjustable set screws 39 may be provided for support of chamber 25 so that corrections may be made in the alignment of the magnetic field with that of chamber 25.

It should be understood that although Helmholtz coil configuration has been found to induce an acceptable magnetic field, apparatus 10 may employ any device or method which would furnish a field, either stationary or time-varient, that would induce the desired motion of the plasma region. Indeed, dependent upon the specific geometry utilized for material deposition and characteristics of the deposition material, motions other than circular may be preferred for different applications.

Arc current power supply 15 includes a low voltage (for example, between approximately 30 to 200 volts), low magnitude direct current (for example, between approximately 2 to 10 amperes) power source for electrical connection between anode 11 and cathode 12. The exact voltage and current necessary to maintain the arc plasma will be principally dependent upon the ionization potential of the deposition material and the separation between anode 11 and cathode 12. However, as lower magnitude currents have been found to be most conducive to non-LTE conditions, it is preferable to utilize the minimum current magnitude necessary to excite the atomic species of the material of interest. For example, successful operation with graphite electrodes separated approximately 9 mm with argon as the carrier gas and zinc as the deposition material has been effected with as little as 2 amperes at 35 volts.

Arc current power supply 15 should be regulated in any of the numerous manners well-known to the skilled artisan as fluctuations in current magnitude may adversely affect arc plasma motion. Additionally, power supply 15 may incorporate a high voltage impulse generator such as a Tesla coil to furnish the potential required to cause initial breakdown of the gas introduced between anode 11 and cathode 12 and the striking of an arc therebetween.

Several techniques are available for introduction of the deposition material into the carrier gas in chamber 25. First, a reservoir 40 may be bored in cathode 12 a short distance behind its tapered end 20 and a powdered supply of the desired deposition material placed therein. During operation, cathode 12 in the vicinity of the reservoir reaches temperatures sufficient to vaporize the deposition material, which is carried into the arc plasma by the carrier gas, and activated into states where its atomic species exist in the plasma, which species are then transported by the carrier gas to the deposition site. Although straightforward, the use of reservoir 40 requires periodic shutdown of apparatus 10 for replenishment of this finite material supply.

Figure 4:
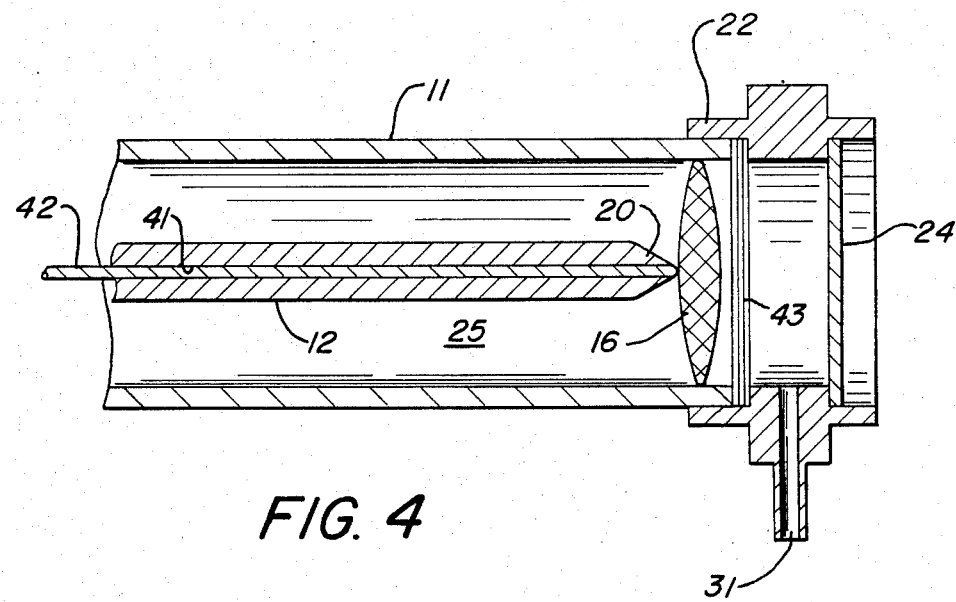
FIG. 4 is a side elevational view of an alternate apparatus in accordance with the present invention having a continuous feed mechanism for the introduction of the deposition material into the plasma, and a deposition substrate surface internal to the anode in the region of the plasma arc.

Instead of or in addition to the use of reservoir 40, as shown in FIG. 4 a small bore 41 may be made through the longitudinal axis of cathode 12 and the deposition material 42 continuously fed into chamber 25 therethrough. Here again temperatures in the vicinity of tapered end 20 would vaporize the deposition material 42 for introduction into the arc plasma.

Instead of or in addition to the use of reservoir 40 or small bore 41, the deposition material may be vaporized within chamber 25 by means for applying heat from an energy source, such as a laser placed external to chamber 25. The laser beam utilized could pass through the sapphire end plates 23, 24, which end plates in another embodiment could also provide optical access for still or motion photographic equipment, including real-time video monitors.

The deposition material may be vaporized externally to apparatus 10 and injected into the carrier gas prior to its entrance into chamber 25. In this instance, however, it may be necessary to preheat the carrier gas and maintain it at an elevated temperature so that the vaporized deposition material does not condense prior to introduction into the arc plasma.

Deposition may take place in a region either within chamber 25 as best depicted in FIG. 4, or externally to chamber 25 as shown in FIGS. 1 and 3. When depositions are to be made within chamber 25, a substrate 43 may be interposed between the end of anode 11 and the housing 22, opposite the end plate 23, through which cathode 12 enters chamber 25. In this instance cathode 12 is extended within chamber 25 until arc plasma region 16 is either adjacent or in spaced apart relation to target substrate 43.

Deposition external of chamber 25 may be effected by inclusion of an exit orifice 44 within anode 11. Inasmuch as the periphery of the arc has been found to contain the greatest concentration of species in non-LTE conditions, appropriate alignment of arc plasma region 16 in slight offset proximity to exit orifice 44 will result in a jet stream of plasma exiting chamber 25 therethrough, permitting the most efficient deposition upon any substrate positioned within the jet stream of plasma.

Microspheroidal substrates such as glass microballons may be removeably mounted within chamber 25 by utilization of a mounting stalk communicating through a suitable opening in chamber 25. In addition, for complete and uniform deposition of the coating material, such substrates may be positioned within chamber 25 or levitated by means of a gas suspension jet or a laser beam (not shown) entering chamber 25.

Multiple arc plasma regions, useful for establishing a greater concentration of species of the deposition material in the substrate area, may be established by the insertion of additional cathodes into chamber 25. Merely by way of example, a second cathode (not shown) may be inserted into chamber 25 as illustrated in FIGS. 1 and 3 through end plate 24 in the same manner as that of cathode 12.

Apparatus 10 operates to generate arc plasmas in relatively high pressure (for example, from approximately 0.1 to about 3 atmospheres) and exhibiting non-LTE conditions preferable for the deposition of various materials on a variety of substrates such as quartz, glass or metal. With regard to the embodiment most favorably depicted in FIG. 3, in preparation for operation, a supply of the deposition material, including but not limited to silicon, metals, semiconductor dopant or component elements and particularly metals having a moderate to high ionization potential, are placed in powdered form in reservoir 40, and cathode 12 placed in chamber 25 so that its tapered end 20 is proximate exit orifice 44. A carrier gas, preferably of an inert element such as argon, is passed through chamber 25 via gas ports 30 and 31, thereby purging chamber 25 of other gases.

Active operation is begun by the energization of coils 33 and 34 with power furnished by direct current source 35 so as to establish the magnetic field by which rotation of the plasma region is induced. Next the Tesla coil in arc current power supply 15 generates a high voltage impulse resulting in an arc being struck between tapered end 20 of cathode 12 and the inner periphery of the anode radially closest thereto. Contemporaneously therewith arc current power supply 15 impresses across anode 11 and cathode 12 the low voltage, direct current sufficient to maintain the established arc in the preselected gaseous carrier. The plasma produced by the arc reaches temperatures of several thousand degrees. The heat produced by the arc is conducted to the cathode, vaporizing the metal or other deposition material for transport into the arc plasma for activation into states where its species exist in the plasma. The carrier gas further transports these species out exit orifice 44 where anything in that vicinity (such as glass microballon targets as used in nuclear fusion reactions) may be uniformly coated with metal at thickness of from less than one micron to several microns. As previously noted, the substrate to be coated would be mounted within anode 11, and cathode 12 appropriately positioned such that the species strike the substrate.

Inasmuch as the present invention is subject to many variations, modifications and changes in detail, a number of which have been expressly stated herein, it is intended that all matter described throughout this entire specification or shown in the accompanying drawings be interpreted as illustrative and not in a limiting sense. It should thus be evident that a device constructed according to the concept of the present invention, and reasonably equivalent thereto, will accomplish the objects of the present invention and otherwise substantially improve the art of generating an arc plasma having non-LTE conditions in a relatively high pressure environment for deposition of materials upon substrates.

I claim:

1. An apparatus for depositing a material on a substrate from an arc plasma, said apparatus comprising:
    a chamber within which a plasma arc may be struck and maintained;
    a tubular first electrode having a first central axis, opposing ends and defining a wall of said chamber;
    end plates closing said ends of said first electrode to define said chamber;
    a housing for mounting said end plates on said first electrode including a port in communication with the interior of said chamber for passage of a preselected gas into said chamber;
    a second electrode coaxial with said first electrode, said second electrode having a tip for supporting said arc, said second electrode extending into said chamber through one of said end plates;

magnet means for establishing a magnetic field proximate said tip for inducing rotation of said plasma around said central axis of said first electrode;

means for introducing into said plasma a material to be deposited on a substrate; and an orifice in said first electrode having a second central axis transverse to said first central axis and proximate said tip for passage out of said chamber of a tangential portion of said rotating plasma bearing said material to deposited to a substrate.

2. An apparatus, as set forth in claim 1, wherein said second electrode is a cathode tapered at said tip.

3. An apparatus, as set forth in claim 2, wherein said cathode is formed of graphite.

4. An apparatus, as set forth in claim 1, wherein said magnet means includes coil means for generating a uniform magnetic field whose principal longitudinal flux axis is aligned with the longitudinal axis of said first electrode.

5. An apparatus, as set forth in claim 4, wherein said coil means generates a stationary magnetic field having flux lines at right angles to said central axis.

6. An apparatus, as set forth in claim 5, wherein said tubular first electrode is a cylindrically shaped hollow anode, said coil means includes a first toroidal coil and a second toroidal coil positioned in longitudinal axial alignment with said anode radially outward of the ends of said anode.

7. An apparatus, as set forth in claim 6, wherein said anode is formed of graphite.

8. An apparatus, as set forth in claim 6, wherein said means for establishing a magnetic field further includes a direct current source furnishing electrical power to said first coil and said second coil.

9. An apparatus, as set forth in claim 1, wherein said magnet means includes means for generating a time-variant magnetic field.

10. An apparatus, as set forth in claim 1, wherein said means for introducing a material to be deposited on a substrate includes a reservoir bored into said second electrode proximate said tip for receiving a quantity of said material.

11. An apparatus, as set forth in claim 1, wherein said means for introducing a material to be deposited on a substrate includes a passageway within said second electrode having openings at said tip and outside said chamber for continuously passing said material into said chamber.

* * * * *

UNITED STATES PATENT AND TRADEMARK OFFICE
CERTIFICATE OF CORRECTION

PATENT NO. : 4,536,640
DATED : August 20, 1985
INVENTOR(S) : Vladimir Vukanovic

It is certified that error appears in the above-identified patent and that said Letters Patent is hereby corrected as shown below:

In the title delete "Non-Logical" and substitute therefor --Non-Local--.

In column 7, line 12, before the word deposited insert --be-- and after the word deposited, delete "to" and substitute therefor --on--.

Signed and Sealed this

Third Day of December 1985

[SEAL]

*Attest:*

DONALD J. QUIGG

*Attesting Officer*  Commissioner of Patents and Trademarks